United States Patent
Zhou et al.

(10) Patent No.: US 10,183,816 B2
(45) Date of Patent: Jan. 22, 2019

(54) APPARATUS FOR PICKING AND PLACING A PLATE-LIKE PRODUCT

(71) Applicants: Boe Technology Group Co., Ltd., Beijing (CN); Chengdu Boe Optoelectronics Technology Co., Ltd., Sichuan (CN)

(72) Inventors: Liang Zhou, Beijing (CN); Hua Li, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 233 days.

(21) Appl. No.: 14/915,302

(22) PCT Filed: Aug. 18, 2015

(86) PCT No.: PCT/CN2015/087370
§ 371 (c)(1),
(2) Date: Feb. 29, 2016

(87) PCT Pub. No.: WO2016/145781
PCT Pub. Date: Sep. 22, 2016

(65) Prior Publication Data
US 2017/0036867 A1     Feb. 9, 2017

(30) Foreign Application Priority Data
Mar. 16, 2015  (CN) .......................... 2015 1 0114378

(51) Int. Cl.
*B65G 49/06* (2006.01)
*B60P 3/00* (2006.01)
*H01L 21/677* (2006.01)

(52) U.S. Cl.
CPC ............ *B65G 49/067* (2013.01); *B60P 3/002* (2013.01); *B65G 49/068* (2013.01); *H01L 21/67778* (2013.01)

(58) Field of Classification Search
CPC ......... B60P 3/002; B62B 3/02; B65G 49/061; B65G 49/064; B65G 49/065;
(Continued)

(56) References Cited

U.S. PATENT DOCUMENTS 7,946,799 B2     5/2011   Uratani et al.
2012/0004773 A1  1/2012   Furuya

FOREIGN PATENT DOCUMENTS

CN     2478977      2/2002
CN     102642716    8/2012
(Continued)

OTHER PUBLICATIONS

CN 202670741 U Machine Translation, Publication Date: Jan. 16, 2013, Xie, Jun (Year: 2013).*
(Continued)

*Primary Examiner* — Saul Rodriguez
*Assistant Examiner* — Brendan P Tighe
(74) *Attorney, Agent, or Firm* — Calfee, Halter & Griswold LLP

(57) ABSTRACT

An apparatus for picking and placing a plate-like product comprises: a base; at least two guide rods disposed on said base vertically; a picking and placing device mounted on each of said guide rods vertically slidably, the picking and placing device is telescopic in a horizontal direction to smoothly and steadily pick and place the plate-like product; a driving device disposed on said base, said driving device connects with said picking and placing device for driving said pick and place device to slide along the respective guide rods.

19 Claims, 4 Drawing Sheets

(58) Field of Classification Search
CPC ............... B65G 49/067; B65G 49/068; H01L 21/67778; H01L 21/67781; Y10S 414/141
USPC ..................................................... 414/744.3
See application file for complete search history.

(56) References Cited

FOREIGN PATENT DOCUMENTS

| | | |
|---|---|---|
| CN | 102765557 | 11/2012 |
| CN | 202670741 | 1/2013 |
| CN | 103434550 | 12/2013 |
| CN | 204124650 | 1/2015 |
| CN | 204197789 | 3/2015 |
| CN | 104692014 | 6/2015 |
| JP | 2000318808 | 11/2000 |
| JP | 2004224478 | 8/2004 |
| JP | 2014093462 | 5/2014 |

OTHER PUBLICATIONS

Office Action on China Application No. 201510114378.9 dated Dec. 13, 2016.
International Search Report and Written Opinion from PCT/CN15/87370 dated Dec. 25, 2015.
Office action from Chinese Application No. 201510114378.9 dated Apr. 22, 2016.

* cited by examiner

APPARATUS FOR PICKING AND PLACING A PLATE-LIKE PRODUCT

RELATED APPLICATIONS

The present application is the U.S. national phase entry of PCT/CN2015/087370, with an international filing date of Aug. 18, 2015, which claims the benefit of Chinese Patent Application No. 201510114378.9, filed on Mar. 16, 2015, the entire disclosures of which are incorporated herein by reference.

TECHNICAL FIELD

The present invention relates to the technical field of substrate detection, in particular to an apparatus for picking and placing a plate-like product.

BACKGROUND

Currently, when a substrate is going to be preliminarily detected, usually a worker takes down the substrate from a cabinet, and holds it at hand for detecting whether there is a defect on the substrate by eyes. However, during picking and placing the substrate, the worker needs to hold the substrate by hand all the time. Since the hands of the worker would inevitably move, especially with prolonged of time holding the substrate, the movements of the hands would be transferred to the substrate, resulting in larger unsteady movements of the substrate, which easily leads to a crack or damage of the substrate, and in turn generates the defects of the substrate during picking and placing the substrate.

SUMMARY

The objective of the application is providing an apparatus for picking and placing a plate-like product, for reducing the defects generated during picking and placing the substrate.

For realizing the above objective, this application proposes the following technical solutions:

An apparatus for picking and placing a plate-like product, comprising: a base; at least two guide rods disposed on said base vertically; and a picking and placing device mounted on each of said guide rods vertically slidably. The picking and placing device is telescopic in a horizontal direction to smoothly and steadily pick and place the plate-like product. A driving device is disposed on said base, and said driving device connects with said picking and placing device for driving said pick and place device to slide along the respective guide rods.

In some embodiments, the picking and placing device comprises: a connecting portion vertically slidably mounted on the respective guide rods, a telescopic portion horizontally slidably mounted on the connecting portion, and a carrying portion connected with the telescopic portion for carrying the plate-like product. The connecting portion is further connected to said driving device, and said connecting portion slides along the respective guide rods to drive the telescopic portion and the carrying portion to move up and down.

In some embodiments, the carrying portion comprises a triangle plate, a trapezoidal plate or two bar-type plates spaced from each other.

In some embodiments, the telescopic portion is provided with a locking pin, the connecting portion is provided with a locking slot, and the locking pin extends through the locking slot to fix the telescopic portion to the connecting portion.

In some embodiments, the numbers of the locking pin and the locking slot are both one, and the locking slot is provided at the position of the connecting portion which corresponds to the locking pin when the telescopic portion slides to a farthest position.

In some embodiments, two ends of the telescopic portion are each provided with one locking pin, and two regions of the connecting portion which correspond to two ends of the telescopic portion are each provided with one locking slot.

In some embodiments, there are multiple locking slots, which are disposed at intervals on the connecting portion along the length direction of the connecting portion.

In some embodiments, the number of the guide rods is four, and the four guide rods are disposed at four corner regions of the base respectively.

In some embodiments, the driving device comprises two lead screws and two motors, the two lead screws are disposed correspondingly and located at the middle regions of two adjacent guide rods respectively, one ends of the two lead screws are each connected with an output axis of one of the motors, and the picking and placing device is mounted slidably on the two lead screws through nuts to be driven by the lead screws.

In some embodiments, said driving device comprises a hydraulic cylinder or air cylinder, therein a cylinder body of the hydraulic cylinder or air cylinder is connected to the base, and a piston of the hydraulic cylinder or air cylinder is connected to said picking and placing device.

In some embodiments, the apparatus for picking and placing a plate-like product further comprises a switch device connected to the two motors respectively for controlling the operation states of the two motors.

In some embodiments, the switch device comprises a knob, which is mounted on the base, and is connected to the two motors respectively.

In some embodiments, the switch device comprises a knob and a button, which are both connected to the two motors respectively.

In some embodiments, the apparatus for picking and placing a plate-like product further comprises a synchronization control circuit for making the two motors running synchronously.

In some embodiments, the apparatus for picking and placing a plate-like product further comprises multiple sliders, each of which is mounted on the respective guide rods vertically slidably, the picking and placing device is connected slidably with each corresponding guide rod through the respective slider, the connections between the picking and placing device and the respective sliders are detachable, and the connection between the picking and placing device and the driving device is detachable.

In some embodiments, the picking and placing device and the respective sliders are connected by bolts.

In some embodiments, the sliders are provided with bolt holes, and the regions of the picking and placing device which correspond to the bolt holes are provided with through holes.

In some embodiments, the apparatus for picking and placing a plate-like product further comprises a plurality of cylindrical pins, the side of each of the sliders is respectively provided with a first groove, the regions of the picking and placing device which correspond to the respective first grooves are each provided with a second groove, each of said cylindrical pin extends through a set of the first groove and second groove provided correspondingly, the picking and placing device is connected detachably with the corresponding respective sliders by the respective cylindrical pins.

In some embodiment, the bottom of the base is provided with four trundles connected with the base for moving the base.

When picking and placing the substrate with the apparatus for picking and placing a plate-like product provided by the above technical solution, the substrates to be picked normally are placed in a cabinet at intervals, and the apparatus for picking and placing a plate-like product is situated next to the cabinet or the cabinet is placed on the base of the apparatus; under the driving of the driving device, the picking and placing device slides near to the substrate to be picked along the guide rods, and then picks or places back the substrate to be picked smoothly and steadily by the telescopic moving of the picking and placing device. During picking and placing the substrate with the apparatus for picking and placing a plate-like product, the picking and placing device can ensure the substrate within a relative steady state, thus reducing unwanted movements of the substrate during picking and placing the substrate, and in turn reducing the defects generated during picking and placing the substrate.

BRIEF DESCRIPTION OF FIGURES

The figures illustrated here are provided for further understanding of the application, and constitute a part of the application. The exemplary embodiments and the descriptions thereof in the application are used for explaining the application, and cannot be construed as limitation of the application.

DESCRIPTION FOR REFERENCE SIGNS

1: base; 2: guide rod; 3: connecting portion;
32: telescopic portion; 33: carrying portion; 41: locking pin;
42: locking slot; 51: lead screw; 52: motor;
6: slider; 61: first groove; 7: cylinder pin;
8: truckle; 9: cabinet.

SPECIFIC EMBODIMENTS

For further illustrating the apparatus for picking and placing a plate-like product provided by an embodiment of the application, it would be described at detail in conjunction with the figures.

Figure 1:
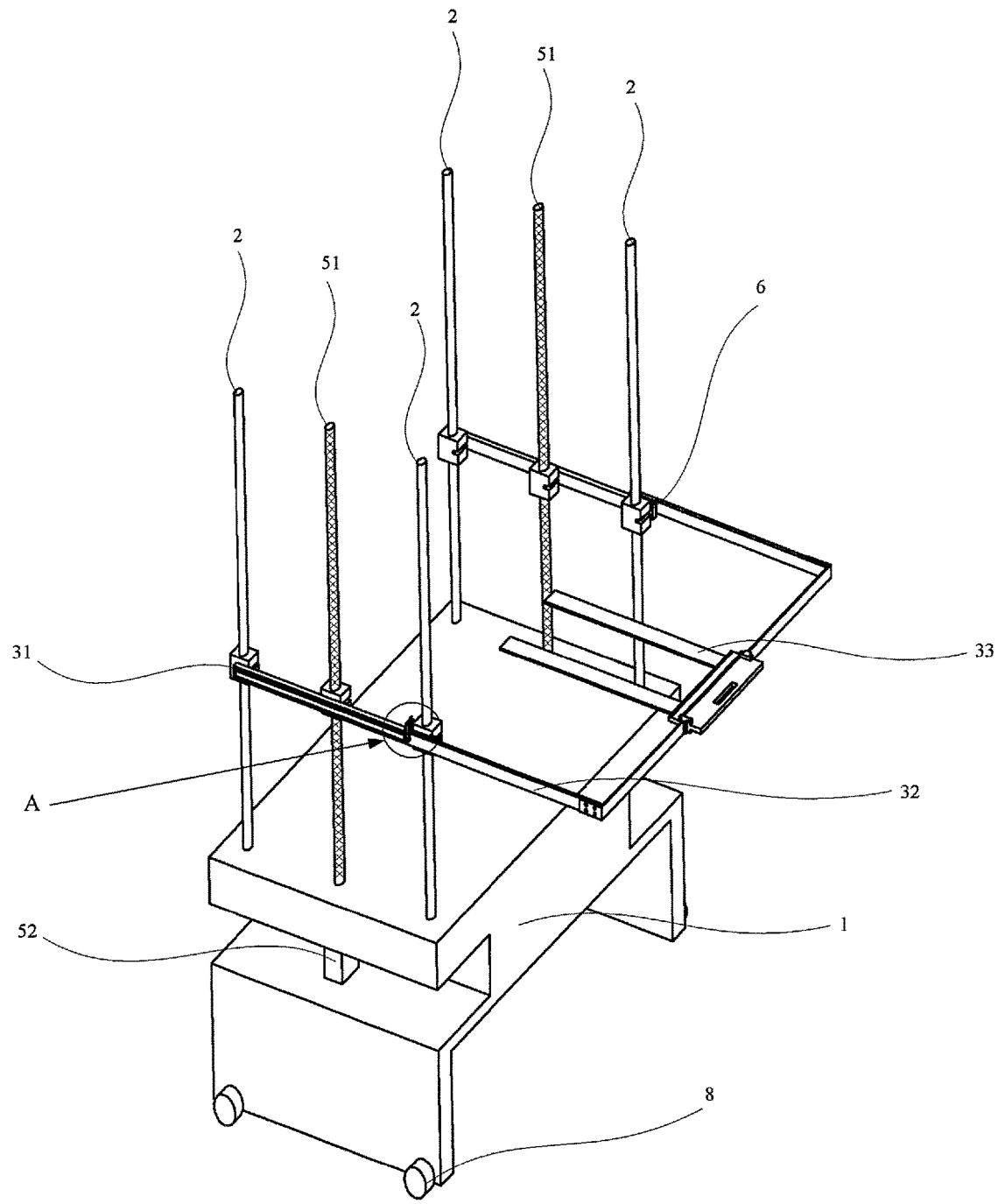
FIG. 1 is a structural schematic view of an apparatus for picking and placing a plate-like product described by an embodiment of the application.

Please refer to FIG. 1. The apparatus for picking and placing a plate-like product comprises: a base 1; at least two guide rods 2 disposed on said base 1 vertically; a picking and placing device mounted on each of said guide rods 2 vertically slidably, the picking and placing device is telescopic in a horizontal direction to smoothly and steadily pick and place the plate-like product; a driving device disposed on said base 1, said driving device connects with said picking and placing device for driving said pick and place device to slide along the respective guide rods 2.

Figure 3:
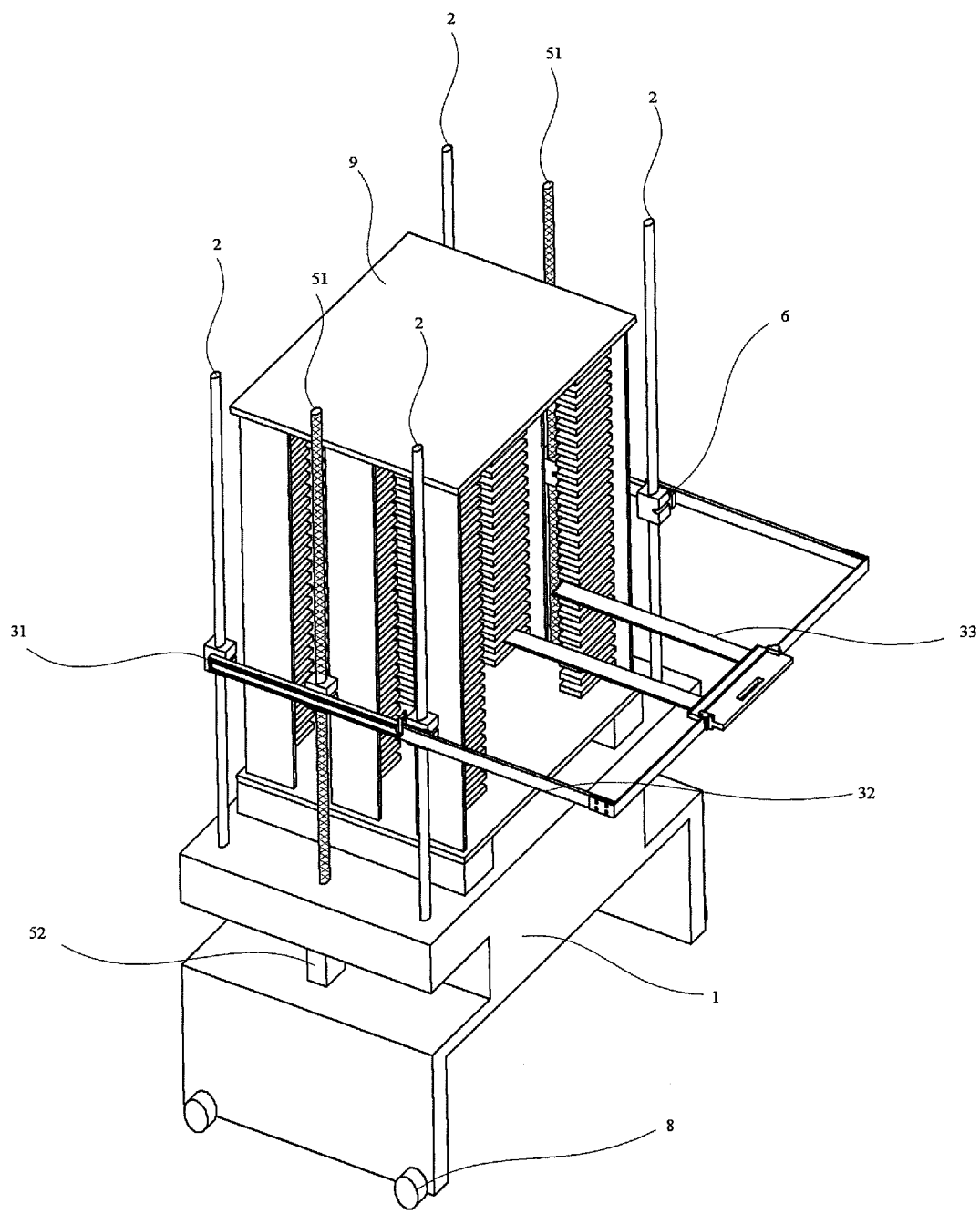
FIG. 3 is a schematic view of the apparatus for picking and placing a plate-like product described by an embodiment of the application under working state.

Please refer to FIG. 3. When picking and placing the substrate with the apparatus for picking and placing a plate-like product described above, the substrates to be picked normally are placed in a cabinet 9 at intervals, and the apparatus for picking and placing a plate-like product is situated next to the cabinet 9 or the cabinet 9 is placed on the base 1 of the apparatus. By actuating the driving device, the picking and placing device slides near to the substrate to be picked along the guide rods 2, and then picks or places back the substrate to be picked smoothly and steadily by the telescopic moving of the picking and placing device. For example, the carrying portion 33 of the apparatus (see the description below for details) extends into the interior of the apparatus, and the cabinet 9 is placed on the base of the apparatus. When a substrate in the cabinet 9 is to be picked with the apparatus shown in FIG. 3, in order to avoid the picking and placing device touching the cabinet 9, the driving device drives the picking and placing device to move to a horizontal position corresponding to the bottom of the substrate at the top layer. Then the picking and placing device is retracted, to make a part of the picking and placing device align just below the substrate at the top layer. The picking and placing device is driven to move up a distance by the driving device again, to lift the substrate at the top layer. Then, the picking and placing device is forced to stretch, to restore the picking and placing device to the original state, thus picking the substrate at the top layer out of the cabinet 9. Defects of the substrate can be detected while the substrate is on the picking and placing device. When the detection for the substrate at the top level is finished, the picking and placing device is retracted to move the substrate back to the cabinet 9 smoothly and steadily. Then, the picking and placing device is driven by the driving device to move down a distance to place the substrate back at the corresponding placing position in the cabinet 9 smoothly and steadily.

However, the apparatus is not limited to the above. In another embodiment of the application, the carrying portion 33 of the apparatus for picking and placing a plate-like product (see the description below for details) may extend towards the exterior of the apparatus. At this time, when the substrate in the cabinet 9 is to be picked, the apparatus is placed next to the cabinet 9, and the driving device drives the picking and placing device to entirely move to a horizontal position corresponding to the bottom of the substrate to be picked. Then the picking and placing device is forced to stretch outwards, to make a part of the picking and placing device align just below the substrate at the top layer. The picking and placing device is driven to entirely move up a distance by the driving device again, to lift the substrate at the top layer. Then, the picking and placing device is forced to retract, to restore the picking and placing device to the original state, pick the substrate at the top layer out of the cabinet 9, and the defects of the substrate can be detected on the picking and placing device. After the detection is finished, the substrate is placed back in the steps in a reverse order.

During picking and placing the substrate with the apparatus for picking and placing a plate-like product, the picking and placing device can ensure movement of the substrate within a relative steady state, thus reducing the unwanted movements of the substrate during picking and placing the substrate, and in turn reducing the defects generated during picking and placing the substrate.

Referring again to FIG. 1, the above picking and placing device specifically comprises: a connecting portion 31 vertically slidably mounted on the respective guide rods 2, a telescopic portion 32 horizontally slidably mounted on the connecting portion 31, and a carrying portion 33 connected with the telescopic portion 32 for carrying the plate-like product. The connecting portion 31 is further connected to the driving device, the connecting portion 31 slides along the respective guide rods 2 to drive the telescopic portion 32 and the carrying portion 33 to move up and down. When picking the substrate, the driving device drives the connecting portion 31 to drive the telescopic portion 32 and carrying portion 33 to slide next to the substrate to be picked, then the stretch/retract of the telescopic portion 32 moves the carrying portion 33 to just below the substrate, and after that, the driving device drives the connecting portion 31 to move up a distance, to make the carrying portion 33 lift the substrate. Then, the telescopic portion 32 is forced to move back to the original position, so as to pick the substrate out of the cabinet 9.

For example, see FIG. 3. When the substrate at the top layer in the cabinet 9 is needed to be picked out, the driving device drives the connecting portion 31 to move. The connecting portions 32 drives the telescopic portion 32 and the carrying portion 31 to move, and makes the carrying portion 33 move to a horizontal position corresponding to the bottom of the substrate at the top layer. Then, the telescopic portion 32 is forced to slide along the connecting portion 31, to make the carrying portion 33 just below the substrate at the top layer. The connecting portion 31 is driven to move up a distance by the driving device again, to lift the substrate at the top layer, and then the telescopic portion 32 is moved back to the original position, so as to pick the substrate at the top layer out of the cabinet 9, and the defect of the substrate can be detected under the support of the carrying portion 33. When the detection of the substrate is finished, firstly the telescopic portion 32 is forced to slide along the connecting portion 31, so that the carrying portion 33 drives the substrate to go back in the cabinet 9. Then the connecting portion 31 is driven to move down a distance by the driving device, and the connecting portion 31 drives the telescopic portion 32 and the carrying portion 33 to move down a distance, to place the substrate back to the corresponding placing position in the cabinet 9.

It should be noted that, the sliding of the telescopic portion 32 relative to the connecting portion 31 can be realized by manual driving or mechanical driving. For example, in case of manual driving, when it is needed to make the telescopic portion 32 slide relative to the connecting portion 31, the operator grasps two opposite sides of the telescopic portion 32, and pulls out or pushes back the telescopic portion 32 relative to the connecting portion 31, to slide the telescopic portion 32 horizontally relative to the connecting portion 31. Alternatively, in case of mechanical driving, the telescopic portion further comprises a driving portion, which connects to the connecting portion 31 and the telescopic portion 32 respectively. When the driving portion is an air or hydraulic cylinder, the cylinder body of the hydraulic or air cylinder connects to the connecting portion 31, and the piston of the hydraulic or air cylinder connects to the telescopic portion 32. The piston is controlled to stretch/retract relative to the cylinder body, so as to driving the telescopic portion 32 slide horizontally along the connecting portion 31. Utilizing mechanical driving can make the telescopic device more steady during stretch/retract, but requires a driving portion to be mounted, and the cost is high. Utilizing manual driving does not need a complex driving portion to be mounted, and the cost is lower, but the unsteady movements of the human hand may be transferred to the telescopic device during making the telescopic device to stretch/retract, and in turn the movements may be transferred to the plate-like product. The specific way of driving the telescopic device to stretch/retract can be chosen according to the actual requirements, such as workshop environment, produce budget etc., and of course is not limited by the ways described in this description.

It should be noted that the carrying portion 33 may be made of carbon fiber material, the carrying portion 33 made by which has a light mass, a good flatness, and can reduce the unsteady movements. The carrying portion 33 may be a triangle plate, a trapezoidal plate etc, besides the two bar-type plates spaced from each other as shown in FIG. 1. The base 1 may be a support frame or a stage. When the base 1 is a stage, the cabinet 9 may be moved on the working surface of the stage by a forklift to detect the substrate. The height of the stage may be set as fitting the height during detecting by the operator, making the operator have better body comfort level when performing the operation of picking and placing the substrate and detecting the substrate.

Figure 2:
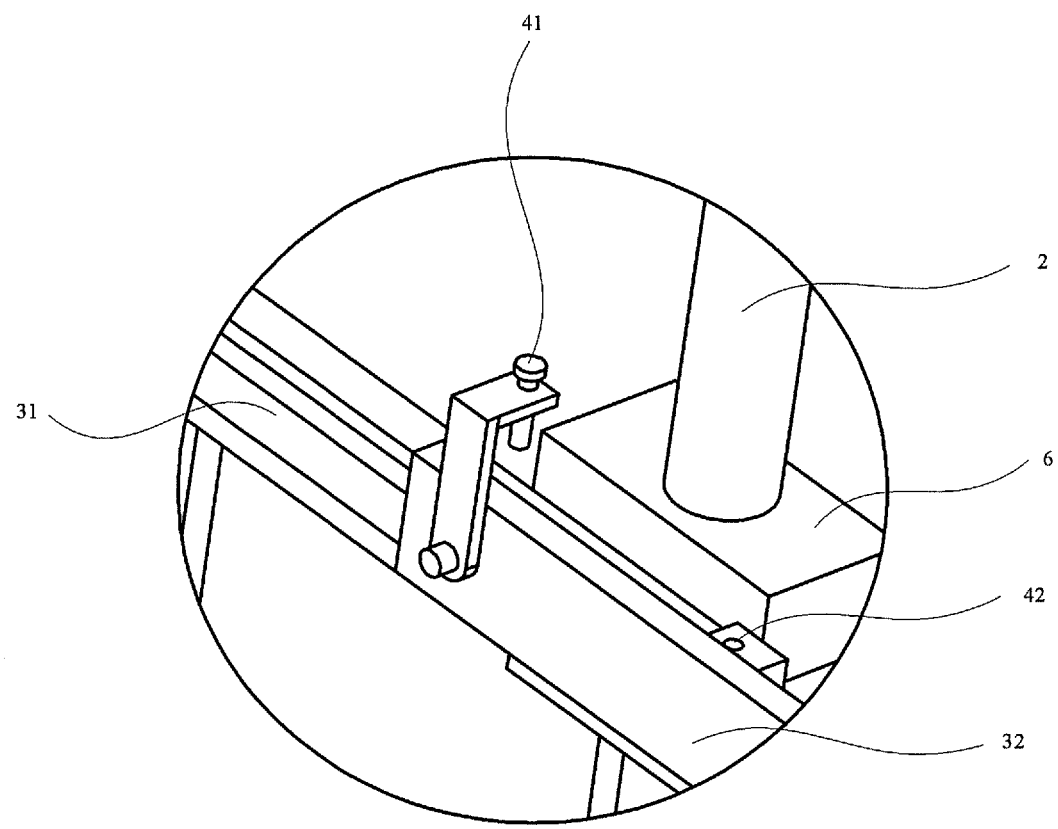
FIG. 2 is an enlarged view of the A region in FIG. 1.

After picking the substrate from the cabinet 9, the substrate can be directly detected for a defect. At this time, for reducing any unsteady movements of the carrying portion 33, see FIG. 2 (it is an enlarged view of A region in FIG. 1), in a preferred embodiment, the telescopic portion 32 is provided with a locking pin 41, the connecting portion 31 is provided with a locking slot 42. For example, there may be one locking slot 42, which is disposed at a position of the connecting portion 31 which corresponds to the locking pin 41 when the telescopic portion 32 slides to a farthest position. Before detecting the substrate for a defect, the locking pin 41 is inserted into the locking slot 42, the locking pin 41 engages with the locking slot 42, and the telescopic portion 32 is fixed to the connecting portion 31, so as to reduce unsteady movements of the telescopic portion 32 during detecting the substrate for a defect, and in turn reduce the unsteady movements of the carrying portion 33. Alternatively, as shown in FIG. 1, two ends of the telescopic portion 32 are each provided one locking pin 41. When the telescopic portion 32 is stretched to a farthest position, two ends of the telescopic portion 32 correspond to two regions of the connecting portion 31, which two regions of the connecting portion 31 are both provided one locking slot 42. Before detecting the substrate for a defect, the two locking pins 41 are inserted into the respective locking slots 42, the two locking pins 41 engage with the two locking slots 42, and the telescopic portion 32 is fixed to the connecting portion 31, so as to reduce the unsteady movements of the telescopic portion 32 during detecting the substrate for a defect, and in turn reduce the unsteady movements of the carrying portion 33. Certainly, there may be multiple locking slots 42, which are disposed on the connecting portion 31 at intervals along a length direction of the connecting portion 31, such that when telescopic portion 32 slides to multiple different positions, the telescopic portion 32 can be fixed to the connecting portion 31, reducing the unsteady movements of the telescopic portion 32.

In order to make the picking and placing device more smooth and steady during rising, see FIG. 1 again. In a preferred embodiment, the number of the guide rods 2 is four, and the four guide rods 2 are disposed at four corner regions of the base 1 respectively. The driving device comprises two lead screws 51 and two motors 52. The two lead screws 51 are disposed correspondingly and located at the middle regions of two adjacent guide rods 2 respectively. One end of each of the two lead screws 51 are connected with an output axis of one of the motors 52, and the picking and placing device is mounted slidably on the two lead screws 51 through nuts. After starting the two motors 52, the output shafts of two motors 52 rotate, and drive the corresponding lead screws 51 to rotate. The two lead screws 51 drive the picking and placing device to move up or down along the guide rods 2 through the nuts provided on the picking and placing device. For example, when the output shafts of the two motors 52 both rotate in forward direction, two output shafts of the two motors 52 drive the respective lead screws 51 to rotate, and the two lead screws 51 drive the picking and placing device to go up. When the output shafts of the two motors 52 both rotate in reverse direction, the two lead screws 51 drive the picking and placing device to go down. Since the left and right ends of the picking and placing device connect to a corresponding lead screw 51 and two guide rods 2 respectively, the situation that the picking and placing device inclines to a certain direction is eliminated during rising. Of course, the driving device is not limited to the motor 52 and the lead screw 51, and can be a hydraulic or air cylinder. When the driving device is a hydraulic or air cylinder, the cylinder body of the hydraulic or air cylinder connects to the base 1, and the piston of the hydraulic or air cylinder connects to the picking and placing device. The piston is controlled to stretch/retract relative to the cylinder body, so as to drive the picking and placing device slide up and down along the guide rods 2.

For facilitating the operator to control the operation states of the motors 52, in an embodiment, the apparatus for picking and placing a plate-like product further comprises a switch device connected to the two motors 52 respectively for controlling the operation states of the two motors 52. In more detail, the switch device can control the on/off state of the motors 52, and control the positive and reverse rotation state of the motors 52, so as to control the rise/drop of the connecting portion 31. The switch device may be a wireless remote, or comprise a knob, which is mounted on the base 1 and is connected to the two motors 52 respectively. For example, when the knob is at an original position, the motors 52 are in the off state. When rotating the knob in a clock direction, the two motors 52 are on, and rotate in a forward direction, and the connecting portion 31 moves up along the guide rods 2. When the knob is rotated back to the original position, the two motors 52 are off, and stop rotating, and the connecting portion 31 stops moving along the guide rods 2. When the knob is rotated in a counter-clock direction from the original direction, the two motors 52 are on, and the two motors 52 rotate in a reverse direction, and the connecting portion 31 moves down along the guide rods 2.

In order to enable quickly powering off the two motors 52, such as when an emergency situation occurs during the running of the two motors 52, the switch device comprises a knob and a button, which are both connected to the two motors 52 respectively. The button controls the on/off state of the two motors 52, and the knob controls the positive/reverse rotation state of the two motors 52. For example, the button is pressed, and the two motors 52 are powered; when rotating the knob in a clock direction, the two motors 52 rotate in a forward direction, and the connecting portion 31 moves up along the guide rods 2; when the knob is rotated in a counter-clock direction, the two motors 52 rotate in a reverse direction, and the connecting portion 31 moves down along the guide rods 2; when the button is pressed again, the two motors 52 are off, and stop running. After it is designed as such, when the two motors 52 are needed to be powered off quickly while an emergency situation occurs during the running of the two motors 52, the button can be pressed, and the two motors 52 can be powered off immediately and stop running. Since the reactive time for pressing the button is shorter than the reactive time for rotating the knob, this kind of switch device improves the safety performance of the apparatus for picking and placing a plate-like product.

It should be noted that the two motors 52 always run synchronously. Specifically, the two motors 52 may be controlled respectively, and the synchronous running of the two motors can be realized by controlling the rotating times and directions of the output shafts of the two motors 52. Alternatively, in a some embodiments, the apparatus for picking and placing a plate-like product further comprises a synchronization control circuit for making the two motors running synchronously, such that the control for the two motors 52 can be more precise, and the synchronous running of the two motors 52 further reduces the occurrence of the situation that the picking and placing device inclines to a direction.

For facilitating the storage and maintenance of the apparatus for picking and placing a plate-like product, in some embodiments, the apparatus for picking and placing a plate-like product further comprises multiple sliders 6, each of which is slidably mounted on a respective guide rods 2. The picking and placing device slidably connects to the corresponding respective guide rods 2 through the respective sliders 6, and the connection between the picking and placing device and the respective sliders 6 can be detachable, and the connection between the picking and placing device and the driving device can be detachable. When the apparatus for picking and placing a plate-like product is needed to be stored, the picking and placing device can be detached from the various sliders 6, and detached from the driving device, so that the space occupied by the apparatus for picking and placing a plate-like product can be reduced. When the picking and placing device is needed to be repaired, it is more convenient to take down the picking and placing device from the apparatus for picking and placing a plate-like product. If the guide rods 2 or the driving device are needed to be repaired, the picking and placing device can be taken down firstly from the apparatus for picking and placing a plate-like product, avoiding the picking and placing device blocking the regions on the guide rods 2 or the driving device where are needed to be repaired.

The picking and placing device and the respective sliders 6 can be connected by bolts. For example, the sliders 6 are provided with bolt holes, and the regions of the picking and placing device which correspond to the bolt holes are provided with through holes. The bolts are inserted through the through holes in the picking and placing device and the bolt holes on the sliders 6 which correspond to the through holes, and rotated, making the picking and placing device and the sliders 6 match closely. When the picking and placing device is needed to be detached from the sliders 6, rotate the bolts reversely, and take out the bolts from the through holes in the picking and placing device and the bolt holes on the sliders 6, then the picking and placing device can be taken down from the sliders 6.

Figure 4:
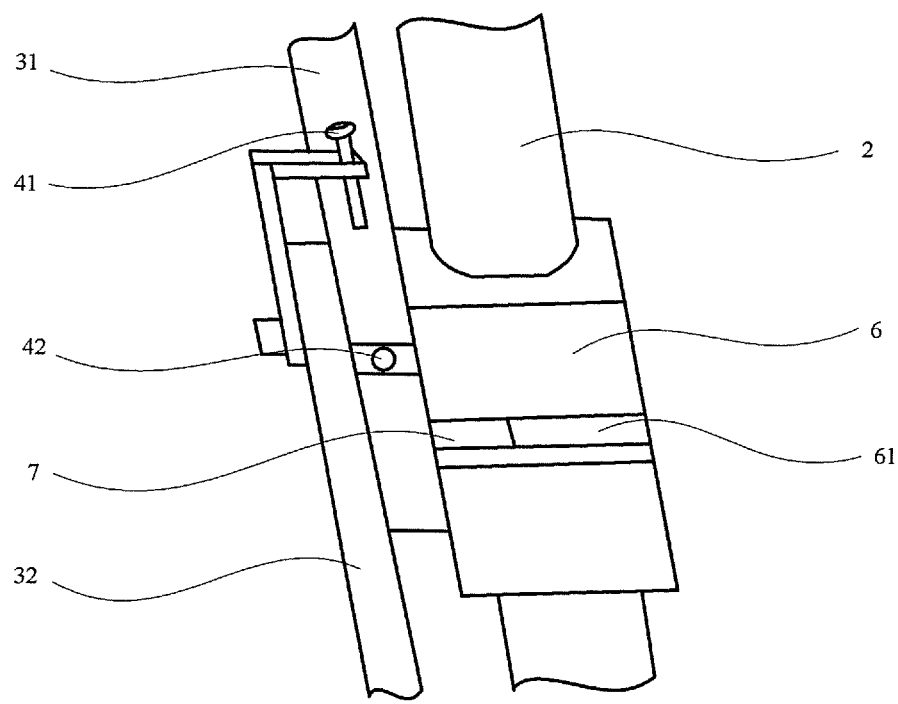
FIG. 4 is a structure schematic view of the connection between the picking and placing device and the slider in the apparatus for picking and placing a plate-like product described by an embodiment of the application.

The connection between the picking and placing device and the sliders may be of other connection ways besides the above connection way. For example, see FIG. 4. The sides of the various sliders 6 are provided with a first groove 61 respectively. The regions of the picking and placing device which correspond to the respective first grooves are provided with a second groove respectively. Each cylindrical pin 7 extends through a set of the first groove 61 and second groove provided correspondingly, so as to engage and connect the picking and placing device with the respective sliders 6. When the picking and placing device is needed to be detached from the sliders 6, the cylinder pins 7 are pulled out from the first grooves 61 and the corresponding second grooves, and then the picking and placing device may be taken down from the sliders 6, so as to facilitate the storage and maintenance of the apparatus for picking and placing a plate-like product.

Normally, there may be a large amount of substrates to be detected in the workshop, and the substrates would be stored in multiple cabinets 9. The distances between the multiple cabinets 9 may be large. When using the above apparatus for picking and placing a plate-like product, it is needed to be moved next to the corresponding cabinet 9 for detecting. For facilitating the moving of the apparatus for picking and placing a plate-like product, please see FIG. 3. In some embodiments, the bottom of the base 1 is provided with four trundles 8 connected with the base 1 for moving the base 1. As such, when promoting the base 1, the four trundles 8 roll, making the moving of the apparatus for picking and placing a plate-like product saving effort.

It should be stated that, the apparatus for picking and placing a plate-like product may not only pick and place a substrate, but also may pick and place other plate-like products.

In the description of the above embodiments, the specific features, structures, materials or characteristics can be combined in suitable ways in any one or more embodiments or examples.

The above are only specific implementations of the application, but the protection scope of the application is unlimited to this. The variations or substitutions easily thought of by those skilled in the art in the technical scope disclosed by the application should be covered within the protection scope of the application. Thus, the protection scope of the application should be subject to the protection scope of the claims. The wording "comprise" in the claims does not exclude the existence of other elements or steps unlisted in the claims. The wording "a" or "an" preceding an element does not exclude the existence of multiple such elements. The mere fact that some measures are recited in mutually different dependent claims does not indicate that the combination of these measures cannot be used to advance.

The invention claimed is:

1. An apparatus for picking and placing a plate-like product, comprising:
   a base;
   at least two guide rods disposed on said base vertically;
   a picking and placing device mounted on each of said guide rods vertically slidably, wherein the picking and placing device is telescopic in a horizontal direction to smoothly and steadily pick and place the plate-like product;
   a driving device disposed on said base, wherein said driving device connects with said picking and placing device for driving said pick and place device to slide along the respective guide rods; and
   multiple sliders, each of which is defined with a vertically extended through hole therein such that the respective guide rod can be inserted through the through hole, a portion of the guide rod located within the through hole being completely wrapped by the slider and hidden wherein the picking and placing device is vertically slidably on the guide rods through the sliders.

2. The apparatus of claim 1, wherein the picking and placing device comprises: a connecting portion vertically slidably mounted on the respective guide rods with a telescopic portion horizontally slidably mounted on the connecting portion; and a carrying portion connected with the telescopic portion for carrying the plate-like product; wherein said connecting portion is further connected to said driving device, and wherein said connecting portion slides along the respective guide rods to drive the telescopic portion and the carrying portion to move up and down.

3. The apparatus of claim 2, therein the carrying portion comprises a triangle plate, a trapezoidal plate or two bar-type plates spaced from each other.

4. The apparatus of claim 2, wherein the telescopic portion is provided with a locking pin, wherein the connecting portion is provided with a locking slot, and wherein the locking pin extends through the locking slot to fix the telescopic portion to the connecting portion.

5. The apparatus of claim 4, wherein the numbers of the locking pin and the locking slot are both one, and wherein the locking slot is provided at the position of the connecting portion which corresponds to the locking pin when the telescopic portion slides to a farthest position.

6. The apparatus of claim 4, wherein two ends of the telescopic portion are each provided with one locking pin, and wherein two regions of the connecting portion which correspond to two ends of the telescopic portion are each provided with one locking slot.

7. The apparatus of claim 4, wherein there are multiple locking slots, which are disposed at intervals on the connecting portion along the length direction of the connecting portion.

8. The apparatus of claim 1, wherein the number of the guide rods is four, and wherein the four guide rods are disposed at four corner regions of the base respectively.

9. The apparatus of claim 8, wherein the driving device comprises two lead screws and two motors, wherein the two lead screws are disposed correspondingly and located at the middle regions of two adjacent guide rods respectively, wherein one ends of the two lead screws are connected with an output axis of one of the motors respectively, and wherein the picking and placing device is mounted slidably on the two lead screws through nuts to be driven by the lead screws.

10. The apparatus of claim 8, wherein said driving device comprises a hydraulic cylinder or air cylinder, wherein a cylinder body of the hydraulic cylinder or air cylinder is connected to the base, and wherein a piston of the hydraulic cylinder or air cylinder is connected to said picking and placing device.

11. The apparatus of claim 9, wherein the apparatus for picking and placing a plate-like product further comprises a switch device connected to the two motors respectively for controlling the operation states of the two motors.

12. The apparatus of claim 11, wherein the switch device comprises a knob mounted on the base and-connected to the two motors respectively.

13. The apparatus of claim 11, wherein the switch device comprises a knob and a button, wherein both are connected to the two motors respectively.

14. The apparatus of claim 9, wherein the apparatus for picking and placing a plate-like product further comprises a synchronization control circuit for making the two motors running synchronously.

15. The apparatus of claim 8, wherein the connections between the picking and placing device and the respective sliders are detachable, and wherein the connection between the picking and placing device and the driving device is detachable.

16. The apparatus of claim 15, wherein the picking and placing device and the respective sliders are connected by bolts.

17. The apparatus of claim 16, wherein the sliders are provided with bolt holes, and wherein the regions of the picking and placing device which correspond to the bolt holes are provided with through holes.

18. The apparatus of claim 15, wherein the apparatus for picking and placing a plate-like product further comprises a plurality of cylindrical pins, wherein the side of each of the sliders is respectively provided with a first groove, wherein the regions of the picking and placing device which correspond to the respective first grooves are provided with a second groove respectively, wherein each of said cylindrical pins extends through a set of the first groove and second groove provided correspondingly, and wherein the picking and placing device is connected detachably with the corresponding respective sliders by the respective cylindrical pins.

19. The apparatus of claim 1, wherein the bottom of the base is provided with four trundles connected with the base for moving the base.

* * * * *